April 22, 1969 W. J. GODSEY ET AL 3,439,616
SOLID STATE DETONATOR FIRING CIRCUIT
Filed Dec. 21, 1964
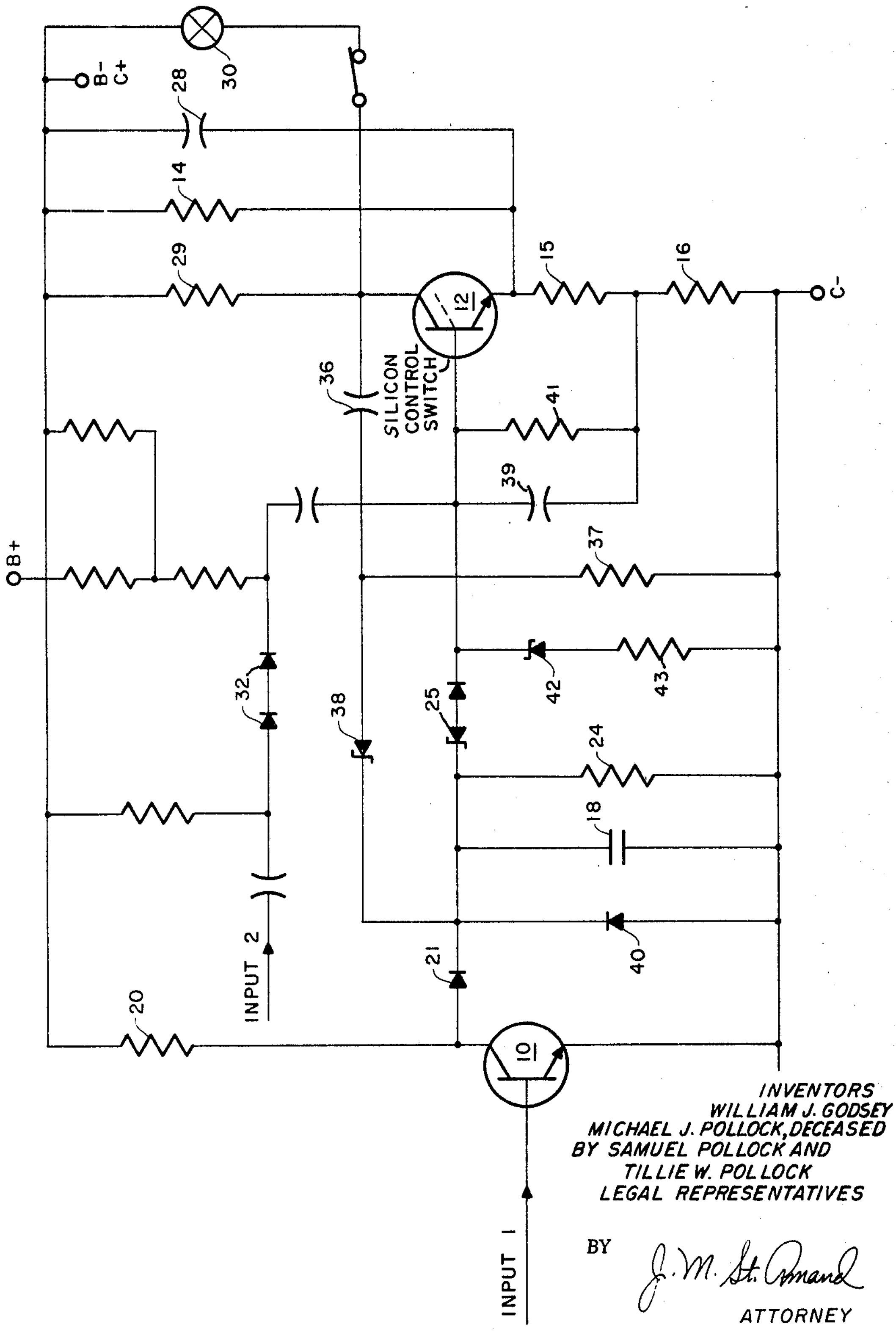
INVENTORS
WILLIAM J. GODSEY
MICHAEL J. POLLOCK, DECEASED
BY SAMUEL POLLOCK AND
TILLIE W. POLLOCK
LEGAL REPRESENTATIVES
BY J. M. St. Amand
ATTORNEY

United States Patent Office 3,439,616 Patented Apr. 22, 1969

3,439,616
SOLID STATE DETONATOR FIRING CIRCUIT

William J. Godsey, Birmingham, Ala., and Michael J. Pollock, deceased, late of Washington, D.C., by Tillie W. Pollock, legal representative, Washington, D.C., assignors, by mesne assignments, to the United States of America as represented by the Secretary of the Navy Filed Dec. 21, 1964, Ser. No. 420,233
Int. Cl. F42c *11/06;* F23q *7/02*
U.S. Cl. 102—70.2 1 Claim The present invention relates to firing circuits and more particularly to a solid state firing circuit for transferring energy to a detonator at a specific controlled time.

The firing circuit of the present invention comprises two alternately conducting transistors with a time constant circuit interconnecting the transistors and another time constant circuit including a squib to be fired connected at the output of a first transistor. A predetermined number of input pulses applied to the second of the transistors will fire the squib in the output circuit of the first. The firing circuit also includes an auxiliary input and a reset feature preventing firing by extraneous signals, noise and the like.

It is an object of the invention to provide a novel solid state firing circuit.

Another object of the invention is to provide a novel firing circuit that cannot be fired by extraneous signals.

A further object of the invention is to provide a novel state firing circuit including an auxiliary input circuit.

Other objects and many of the attendant advantages of this invention will become readily appreciated as the same becomes better understood by reference to the following detailed description when considered in connection with the accompanying drawings wherein:

The figure of drawing is a circuit diagram of a typical embodiment of the invention.

In the circuit illustrated 10 is an NPN transistor and 12 is a silicon control switch. $Input_1$ is applied to the base of transistor 10. Normally transistor 10 is in full conduction and silicon control switch 12 is cutoff by virtue of a bias which is developed from a voltage divider consisting of resistances 14, 15 and 16. Application of negative pulses at the base of transistor 10 will cause it to be cut off during pulse interval. During each such interval capacitor 18 will charge some through resistance 20 and diode 21 in a positive direction. The time constant as determined by resistance 24 and capacitor 18 is such that it discharges only slightly between input pulses. After a predetermined number of input pulses, capacitor 18 will be charged to a sufficient positive voltage to cause conduction of Zener diode 25. The charge on capacitor 18 is then applied directly between the gate and cathode of silicon control switch 12. A further increase in the positive (+) charge of capacitor 18 caused by an additional pulse at $Input_1$ to the base of transistor 10 will cause the total gate-to-cathode bias on silicon control switch 12 to be overcome and cause the switch to conduct.

Capacitor 28, which has been charged to a voltage determined by voltage divider 14, 15 and 16 is now discharged through control switch 12 from cathode to anode and through resistance 29. The resistance of squib 30, which is in parallel with resistance 29, is much less than resistance 29 so that practically all of the energy stored in capacitor 28 is expended in firing the squib.

An auxiliary input, $Input_2$, is available for the firing of squib 30. To do so, a positive pulse at $Input_2$ is required to overcome the bias on diode 32 plus the fixed bias on silicon control switch 12. In the event that control switch 12 is caused to conduct due to random noise input before squib 30 is armed there is a reset feature available in the circuit, which operates as follows: As control switch 12 conducts, the voltage drop at its anode is coupled through capacitor 36 and across resistance 37 to Zener diode 38 which conducts and passes a negative voltage pulse to discharge capacitor 18 to its quiescent value. Diode 40 prevents capacitor 18 from assuming a net negative potential by clamping the charge across capacitor 18 to approximately the C— reference level. As capacitor 28 discharges, the cathode (emitter) of control switch 12 rises to substantially C+. At the same time, since there is no current flow through gate resistor 41, the gate voltage of switch 12 also rises positively from its value of nearly C—. When this gate voltage exceeds the breakdown voltage of Zener diode 42, the current flow through gate resistor 41 causes the gate voltage of switch 12 to be reduced to a value sufficiently negative with respect to the cathode that current flow in switch 12 is cut off. During conduction of Zener diode 42 the current path through gate resistor 41, Zener diode 42 and limiting resistor 43 forms a parallel current path with resistor 16. Also, the action of capacitor 39 and gate resistor 41 provides a small time delay in this cut off action to permit switch 12 to attain complete conduction prior to cut off. Resistor 43 is provided to limit the reverse bias on the gate of switch 12 to a safe operating value.

Obviously many modifications and variations of the present invention are possible in the light of the above teachings. It is therefore to be understood that within the scope of the appended claim the invention may be practiced otherwise than as specifically described.

What is claimed is:

1. A firing circuit comprising:

(a) a normally conducting input transistor and an output silicon control switch, (b) a time constant circuit means interconnecting said transistor and silicon control switch, (c) a voltage divider circuit means connected for biasing said control switch to cut off while said input transistor normally conducts; also a squib to be fired connected in parallel with a resistor of appreciably higher resistance than said squib, this parallel combination connected together in series with a firing capacitor across said silicon control switch, (d) said normally conducting input transistor being cut off during intervals between negative input pulses allowing said time constant circuit means to charge during such pulse intervals, and after a predetermined number of input pulses are applied to said input transistor said time constant circuit means connected thereto being sufficiently charged to apply its charge to the gate of said silicon control switch causing it in turn to conduct to discharge said firing capacitor through said parallel combination of squib and resistor for firing said squib, (e) an auxiliary input circuit connected for applying a signal to also cause said control switch to conduct for firing said squib, (f) reset means connected to said control switch for cutting off any conduction thereof caused by extraneous random signals prior to arming of said squib.

(References on following page)

References Cited

UNITED STATES PATENTS

| | | | |
|---|---|---|---|
| 2,906,206 | 9/1959 | Morison et al. | 102—70.2 |
| 3,049,642 | 8/1962 | Quinn | 315—206 |
| 3,088,410 | 5/1963 | Taylor | 317—80 |
| 3,176,161 | 3/1965 | Vertrees | 307—88.5 |
| 3,225,695 | 12/1965 | Kapp et al. | 102—70.2 |

ARTHUR GAUSS, *Primary Examiner.*

JOHN ZAZWORSKY, *Assistant Examiner.*

U.S. Cl. X.R.

307—252; 317—80